United States Patent [19]

Ishikawa

[11] Patent Number: 5,118,637
[45] Date of Patent: Jun. 2, 1992

[54] METHOD OF FABRICATING HEMT DEVICE WITH SELECTIVE ETCHING OF GALLIUM ARSENIDE ANTIMONIDE

[75] Inventor: Tomonori Ishikawa, Fujisawa, Japan

[73] Assignee: Fujitsu Limited, Kawasaki, Japan

[21] Appl. No.: 643,375

[22] Filed: Jan. 22, 1991

Related U.S. Application Data

[62] Division of Ser. No. 416,944, Oct. 4, 1989, Pat. No. 5,023,675.

[30] Foreign Application Priority Data

Oct. 8, 1988 [JP] Japan ................. 63-252917

[51] Int. Cl.⁵ ............... H01L 21/265; H01L 21/20
[52] U.S. Cl. .............................. 437/41; 437/133; 437/203; 156/656
[58] Field of Search ............. 437/126, 133, 912, 41; 148/DIG. 72, DIG. 65; 357/15, 16

[56] References Cited

U.S. PATENT DOCUMENTS

| | | | |
|---|---|---|---|
| 4,635,343 | 1/1987 | Kuroda | 29/571 |
| 4,733,283 | 3/1988 | Kuroda | 22/357 |
| 4,821,082 | 4/1989 | Frank et al. | 357/34 |
| 4,833,101 | 5/1989 | Fujii | 437/126 |

FOREIGN PATENT DOCUMENTS

| | | |
|---|---|---|
| 0171531 | 2/1986 | European Pat. Off. |
| 0175437 | 3/1986 | European Pat. Off. |
| 0072528 | 9/1987 | Japan .................. 437/133 |

OTHER PUBLICATIONS

Fathimulla et al., "High Performance InGaAs/InGaAs HEMT's and MESFET's", IEEE... Electron Devices, vol. 9, No. 7, 1988, 328-330.

Peng et al., "Microwave Performance of InAlAs/InGaAs/InP MODFET's", IEEE..., Electron Devices, vol. EDL-8, No. 1 1987, 24-26.

C. B. Cooper, III et al., "Use of thin AlGaGs and InGaAs stop-etch layers for reactive ion etch processing of III-V compound semiconductor devices," Applied Physics Letters, vol. 51, No. 26, Dec. 28 1987, pp. 2225-2226.

*Primary Examiner*—Olik Chaudhuri
*Assistant Examiner*—Loc Q. Trinh
*Attorney, Agent, or Firm*—Staas & Halsey

[57] ABSTRACT

A semiconductor device having a heterojunction and utilizing a two-dimensional electron gas formed at said the heterojunction comprises a substrate of a semi-insulating material, a first semiconductor layer of undoped indium gallium arsenide formed on the substrate, a second semiconductor layer of n-type indium aluminium arsenide formed on the first semiconductor layer and defining the heterojunction between the first semiconductor layer and the second semiconductor layer, the second semiconductor layer including an exposed region defining an exposed top surface, a third semiconductor layer of n-type gallium arsenide antimonide formed on the second semiconductor layer and having a window defined therein so as to expose the top surface of the exposed top surface region, a gate electrode formed in self-alignment with the window and in contact with the exposed top surface region of the second semiconductor layer, and ohmic electrodes formed on the cap layer in ohmic contact therewith.

14 Claims, 4 Drawing Sheets

METHOD OF FABRICATING HEMT DEVICE WITH SELECTIVE ETCHING OF GALLIUM ARSENIDE ANTIMONIDE

This application is a division of application No. 416,944, filed Oct. 4, 1989, now U.S. Pat. No. 5,023,675, issued Jun. 11, 1991.

BACKGROUND OF THE INVENTION

The present invention generally relates to so-called high electron mobility transistor (HEMT) devices and more particularly to a HEMT device having a heterojunction between an indium gallium arsenide (InGaAs) active layer and an n-type aluminium indium arsenide (AlInAs) electron supply layer and a manufacturing method thereof.

A direct-coupled FET logic (DCFL) device comprises an enhancement-mode field effect transistor (FET) and a depletion-mode FET and is characterized by low power consumption. Thus, the device is suited for constructing a high speed integrated circuit having a large integration density. In relation to the DCFL device, techniques have been studied intensively for manufacturing an inverter circuit for the DCFL device by employing a compound semiconductor device so as to improve the operational speed of the device further.

Conventionally, there is a known DCFL device comprising an enhancement-mode FET and a depletion mode FET both formed on a common semi-insulating gallium arsenide (GaAs) substrate as is disclosed in the U.S. Pat. Nos. 4,635,343 and 4,733,283, in which the assignee is the same assignee of the present invention. In this device, a two-dimensional electron gas is formed at a heterojunction interface between an undoped GaAs layer on the GaAs substrate and an n-type AlGaAs layer making a direct contact therewith. The two-dimensional electron gas is formed at an upper portion of the undoped GaAs layer and the electrons therein can move without experiencing scattering by the dopants. In other words, the electron mobility in the two-dimensional electron gas is increased and the operational speed of the device is significantly improved.

When manufacturing such a device, a layered body comprising the foregoing GaAs substrate, the undoped GaAs layer, and the n-type AlGaAs layer as well as an n-type GaAs layer provided on the n-type AlGaAS layer, a second n-type AlGaAs layer further provided on the n-type GaAs substrate, and a cap layer of n-type GaAs further provided on the n-type AlGaAs layer, is prepared. Further, a source electrode and a drain electrode are provided on the cap layer according to a predetermined pattern. Next, the layered body is applied with a photoresist and after a suitable patterning for exposing a part of the structure corresponding to a gate electrode of the enhancement-mode FET, the cap layer is removed by a dry etching procedure using a chloride etching gas. When the second n-type AlGaAs layer is exposed, the etching is automatically stopped because of the reduced etching rate in the AlGaAs layer. Note that the etching rate of AlGaAs by chloride gas is smaller by a factor of 200 than the etching rate of GaAs. Then, the n-type AlGaAs layer is removed by a wet etching and after a suitable photolithographic process for exposing another part of the structure corresponding to a gate of the depletion-mode FET, the first n-type GaAs layer corresponding to the gate of the enhancement-mode FET and the cap layer of GaAs corresponding to the gate of the depletion-mode FET are removed by again applying the dry etching using the chloride etching gas. This second dry etching also stops automatically when the n-type AlGaAs layer immediately above the undoped GaAs layer is exposed and when the second n-type AlGaAs layer is exposed. Then the gate electrode for the enhancement-mode FET and the depletion-mode FET are provided and an invertor circuit forming the DCFL is obtained. According to this procedure, the etching is stopped exactly at a desired depth as a result of use of the undoped or doped AlGaAs layer, and the enhancement-mode FET and the depletion-mode FET are formed with an exactly controlled threshold voltage.

Meanwhile, it is known that the operational speed of the HEMT device would be further improved if one could use a heterojunction of n-type aluminium indium arsenide (AlInAs) and undoped indium gallium arsenide (InGaAs). By using an InGaAs layer as the layer for supporting the two-dimensional electron gas, one can increase the electron mobility under a low electrical field and can obtain a high electron velocity under a high electrical field, too. Further, the electron density in the two-dimensional electron gas is increased because of the increased potential barrier established at the heterojunction. Furthermore, the decrease of the electron mobility by electron transfer to the low mobility band is avoided because of the characteristic band structure of InGaAs which exhibits a large energy difference between the L valley and the □ valley. Additionally, there is a further advantage such that InAlAs is substantially free from unwanted deep donor.

Unfortunately, there is no known dry etching technique effectively applicable to the system, such as AlInAs or InGaAs involving indium (In), for providing the gate structure of HEMT a device and thus for manufacturing of the HEMT device using this promising material combination has been extremely difficult even in the case that the device is a simple FET. The device such as inverter is out of question. For example, the dry etching using carbon dichloro-difluoride ($CCl_2F_2$) as the etching gas is virtually ineffective to the material such as InGaAs containing indium. It is believed that the reason for this is the significantly reduced equilibrium vapor pressure of indium trichloride ($InCl_3$) which is formed as a product of the etching reaction (see S. C. McNevin, J. Vac. Sci. Technol., B4 (5) 1986, pp. 1216).

Because of the foregoing reasons, there is so far no report announcing success in constructing a HEMT integrated circuit device in which a heterojunction of n-type AlInAs and InGaAs is used.

SUMMARY OF THE INVENTION

Accordingly, it is a general object of the present invention to provide a novel and useful HEMT device and a manufacturing method thereof wherein the aforementioned problems are eliminated.

Another and more specific object of the present invention is to provide a high speed HEMT device by forming a heterojunction of n-type AlInAs and undoped InGaAs therein.

Another object of the present invention is to provide a high speed HEMT device having a heterojunction of n-type AlInAs and undoped InGaAs wherein the device has a structure which allows easy formation of a gate structure by etching.

Another object of the present invention is to provide a high speed HEMT device having a heterojunction of n-type AlInAs and undoped InGaAs and a method wherein the uniformity of the threshold voltage of FET or FETs formed therein is improved.

Another object of the present invention is to provide a method of manufacturing a HEMT device having a heterojunction of n-type AlInAs and undoped InGaAs wherein an etching treatment for providing a gate structure is performed uniformly and reliably.

Another object of the present invention is to provide a HEMT device comprising a semi-insulating indium phosphide (InP) substrate, a non-doped InGaAs active layer provided on the InP substrate, an n-type InAlAs layer for supplying electron provided on the InGaAs active layer, a cap layer of n-type gallium arsenide antimonide (GaAsSb) provided on the n-type InAlAs layer, a recessed structure provided on a part of the cap layer for exposing the n-type InAlAs layer, a gate electrode provided on the cap layer in correspondence to the recessed structure so as to make a Schottky contact with the n-type InAlAs layer, and a pair of ohmic electrodes provided on the cap layer at both sides of the gate electrode for making an ohmic contact of each electrode with the cap layer. According to the present invention, the cap layer is free from in and thus can be easily etched by conventional dry etching process using a chloride etching gas such as $CCl_2F_2$. As the n-type InAlAs layer is substantially insensitive to the dry etching, the thus obtained HEMT device has a gate structure which is formed with excellent precision and uniformity similarly to the conventional HEMT device using the heterojunction of n-type AlGaAs and GaAs. Further, as a result of the present invention, a large scale integrated circuit of HEMT devices using the heterojunction of the n-type InAlAs layer and the InGaAs active layer can be formed easily and with reliability.

Other objects and further features of the present invention will become apparent from the following detailed description when read in conjunction with attached drawings.

DETAILED DESCRIPTION

Figure 1:
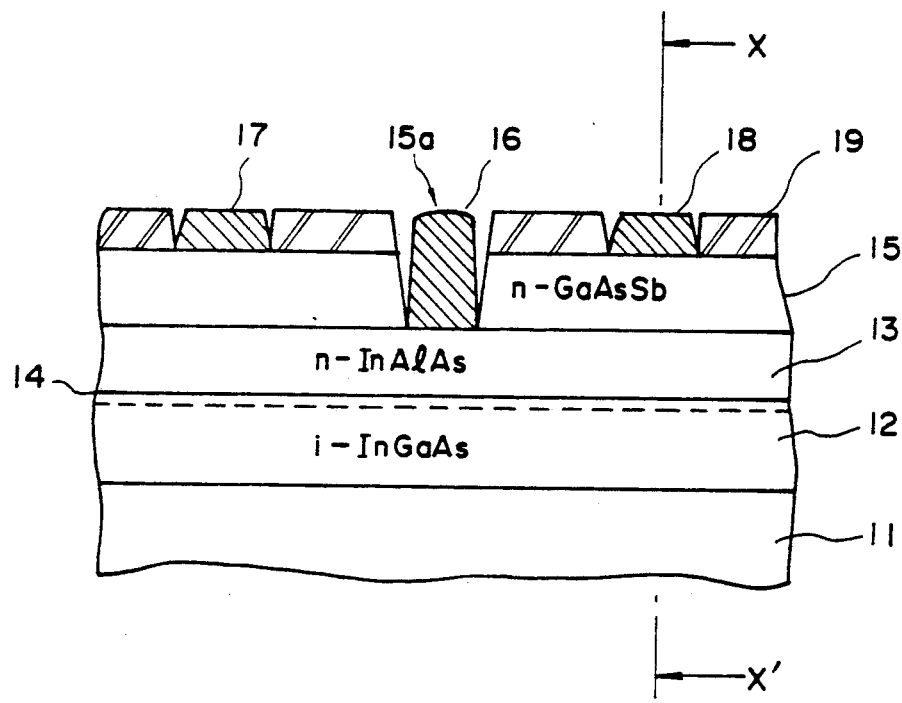
FIG. 1 is a diagram showing a first embodiment of the HEMT device of the present invention.

FIG. 1 shows a first embodiment of the HEMT device of the present invention In this embodiment the device forms an enhancement-mode FET. Referring to the drawing, the device comprises a semi-insulating InP substrate 11 on which an active layer 12 of undoped InGaAs is provided. On the active layer 12, a doped layer 13 is provided such that there is formed a heterojunction 14 at the interface between the layer 12 and the layer 13. The thickness of the layer 13 is chosen such that a desired threshold voltage is obtained for the FET realized by the present device. Further, there is provided a cap layer 15 of GaAsSb on the doped layer 13 except for a recessed gate structure 15a wherein a gate electrode 16 of a metal forming a Schottky contact with InAlAs is provided in contact with the doped layer 13. Further, ohmic electrodes 17 and 18 forming an ohmic contact with GaAsSb are provided on the cap layer 15 as source and drain electrodes respectively. The compositions of the active layer 12, the doped layer 13, and the cap layer 15 are chosen so as to achieve excellent lattice matching of the layers with respect to the substrate and with respect to each other. In one example, the composition of the active layer 12 is set to about $In_{0.53}Ga_{0.47}As$, the composition of the doped layer is set to about $In_{0.52}Al_{0.48}As$, and the composition of the cap layer 15 is set to about $GaAs_{0.51}Sb_{0.49}$.

In operation, electrons are injected into the two dimensional electron gas shown by a broken line at the interface 14, from the ohmic electrode 17 via the cap layer 15 by applying an electrical voltage across the electrodes 17 and 18 and the injected electrons are transported through the active layer 13 along the heterojunction 14 in a form of the two-dimensional electron gas under control of a gate voltage applied to the gate electrode 16 which modifies the band structure in the vicinity of the heterojunction 14 and hence the electron density in the two-dimensional electron gas. The electron passed through the active layer under the gate electrode 16 are then recovered by the other ohmic electrode 18 after passing through the cap layer 15 in a reverse direction. Note that the operational characteristic, particularly the threshold voltage $V_{th}$, is determined as a function of the distance between the gate electrode 16 and the active layer 12, as determined by the thickness of the doped layer 13.

Because in the the difference of band structure between that of InGaAs forming the active layer 12 and that of the n-type InAlAs forming the doped layer 13, there is formed a large discontinuity in conduction band edge at the heterojunction 14 which facilitates the formation of the two-dimensional electron gas. In other words, the electron density in the two-dimensional electron gas is increased because of the large potential barrier and associated deep potential valley appearing at the heterojunction. The advantageous use of the heterojunction between the n-type InAlAs doped layer and the undoped InGaAs active layer is already summarized and will not be repeated.

In the present invention, as a result of the use of GaAsSb for the cap layer 15, the dry etching process used to form the recessed gate structure 15a in the cap layer 15 is performed easily with high precision and high reproducibility as the etching is automatically stopped when it reaches the InAlAs doped layer 13. It was found, further, that there is formed only a limited potential barrier at the junction between the GaAsSb cap layer 15 and the underlying doped layer 13 and the injection of electron through the ohmic electrode 17 or 18 is performed without difficulty.

Figure 2:
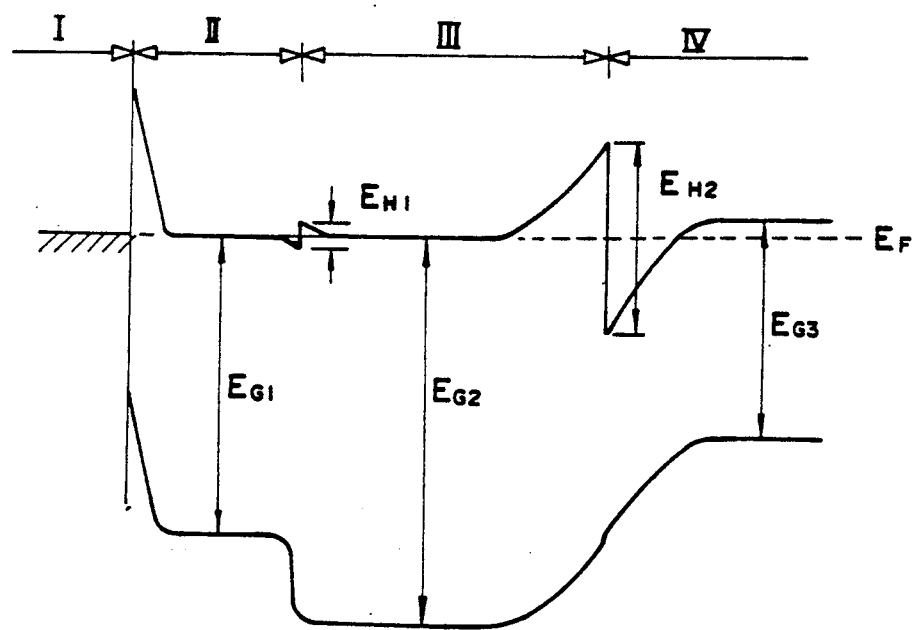
FIG. 2 is a diagram showing a band structure of the device of FIG. 1.

FIG. 2 shows a band structure of the device of FIG. 1 taken along an X-X' line of FIG. 1. In the drawing, the region I corresponds to the ohmic electrode 17 or 18, the region II corresponds to the cap layer 15, the region III corresponds to the doped layer 13 and the region IV corresponds to the active layer 12. Further, the Fermi level is represented as EF, and the band gap the cap layer 15, the doped layer 13 and in the active layer 12 are represented by $E_{G1}$, $E_{G2}$ and $E_{G3}$, respectively. In the HEMT device of FIG. 1 in which the layers 12, 13 and 15 have the foregoing compositions, the band gap assumes the following values.

$$E_{G1} = 0.8 \text{ [eV]}$$
$$E_{G2} = 1.1 \text{ [eV]}$$

-continued
$E_{G3} = 0.6$ [eV]

Further, there is formed a discontinuity $E_{H2}$ in the conduction band at the interface 14 between the active layer 12 and the doped layer 13 as is expected, and in which the band discontinuity $E_{H2}$ takes a value of 0.5 eV. This value is significantly larger than the that of the conventional n-type AlGaAs/GaAs heterojunction which assumes a value of 0.3 eV. Thus, the electron density in the two-dimensional electron gas formed at the interface 14 is increased substantially.

Note that there is also formed a discontinuity in the conduction band edge at the interface between the cap layer 15 and the doped layer 13 having a magnitude of $E_{H1}$. This discontinuity, however, is very small and assumes a value of about 0.05 eV. Thus, although there may be a potential barrier at the interface between the cap layer 15 and the doped layer 13, the electrons can pass substantially freely through this interface and the operation of the device is facilitated. In other words, the combination of the cap layer 15 of GaAsSb and the doped layer 13 of InAlAs does not only enables easy and precise etching of the gate structure using the known etching gas but also reduces the ohmic contact of the ohmic electrodes.

Next, a second embodiment of the HEMT device of the present invention will be described together with a manufacturing process with reference to FIGS. 3 through 8. The HEMT device according to the second embodiment has a structure called an E/D type wherein both an enhancement-mode FET and a depletion-mode FET are formed on a common substrate.

Figure 3:
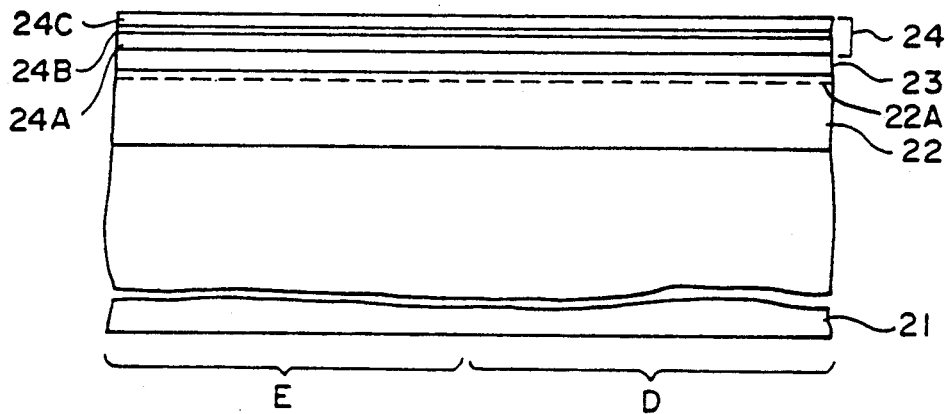
FIGS. 3 through 8 are diagrams showing various steps for manufacturing the HEMT device according to an embodiment of the present invention.

Referring to FIG. 3, a structure comprising a semi-insulating substrate 21 of InP, an active layer 22 of intrinsic type InGaAs having a composition of $In_{0.53}Ga_{0.47}As$, an doped layer 23 of n-type InAlAs having a composition of $In0.52As_{0.48}As$, and a cap layer 24 which in turn comprises three distinct layers to be described, is formed by growing the respective materials consecutively by molecular beam epitaxy (MBE) or metal-organic chemical vapor deposition (MOCVD). Note that the doped layer 23 is grown to a thickness which provides a desired threshold voltage for the enhancement-mode FET formed in the HEMT device. The cap layer 24 is provided in order to reduce the resistance between ohmic electrodes provided thereon and the doped layer 23 thereunder similarly to the device of FIG. 1 and further for establishing a desired threshold voltage for the depletion-mode FET formed in the device. The composition of the layers 22–24 is determined so that there is established excellent lattice matching between these layers including the substrate 21.

In the HEMT device of the present invention, the cap layer 24 comprises a GaAsSb layer 24A doped to the n-type and having a composition of about $GaAs_{0.51}Sb_{0.49}$, an InAlAs layer 24B doped to the n-type and having a composition of about $In_{0.52}Al_{0.48}As$, with a thickness determined so as to provide said desired threshold voltage of the depletion-mode FET, and another GaAsSb layer 24C doped similarly to the n-type and having a composition of about $GaAs_{0.51}Sb0.49$. The thickness of the InAlAs layer 24B is chosen to about 20–30Å. This layer 24B, containing In, also acts as an etching stop layer similarly to the prior art device disclosed in the foregoing U.S. Pat. Nos. 4,635,343 and 4,733,283.

In this structure, there is formed a heterojunction at an interface between the active layer 22 and the doped layer 23, and a two dimensional electron gas is formed in the uppermost part 22a of the active layer 22 as illustrated by a broken line. In the drawing, a part of the structure thus formed in which the enhancement-mode FET is to be formed is designated as E and a part of the structure in which the depletion-mode FET is to be formed is designated as D.

Figure 4:
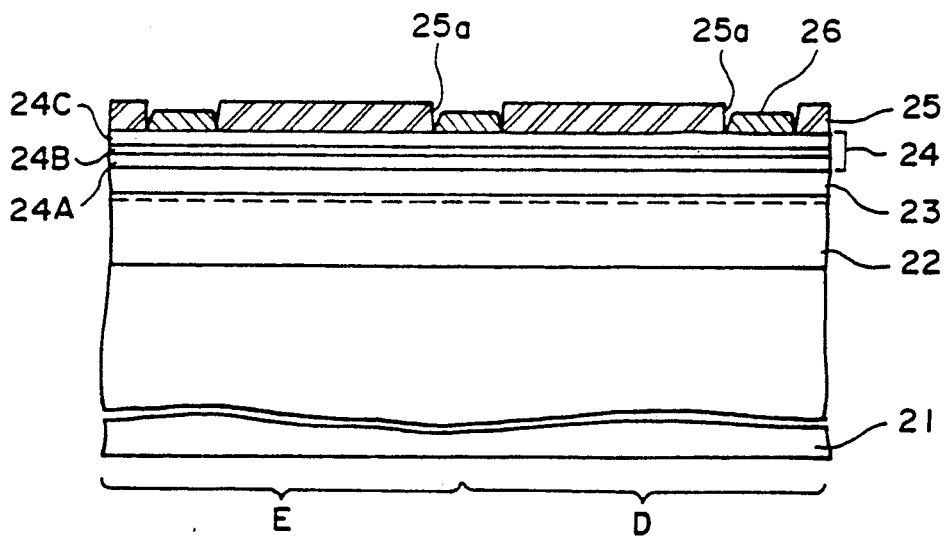

Next, a silicon oxide ($SiO_2$) layer 25 is deposited on the structure of FIG. 3 for device separation and windows 25a are opened through the layer 25 in correspondence to ohmic electrodes to be described by a photolithographic process using a suitably patterned photoresist (not shown). Then, while leaving the photoresist on the silicon oxide layer 25, a metal layer for forming the ohmic electrodes is deposited on the cap layer 24 through the windows 25a by magnetron sputtering. Further, the photoresist on the silicon oxide layer 25 is dissolved and the metal layer filling the window 25a is lifted off so as to form a substantially flush surface with the silicon oxide layer 25. Thus, an ohmic electrode 26 is formed in correspondence to each window 25a defined in the silicon oxide layer 25 as illustrated in FIG. 4.

Figure 5:
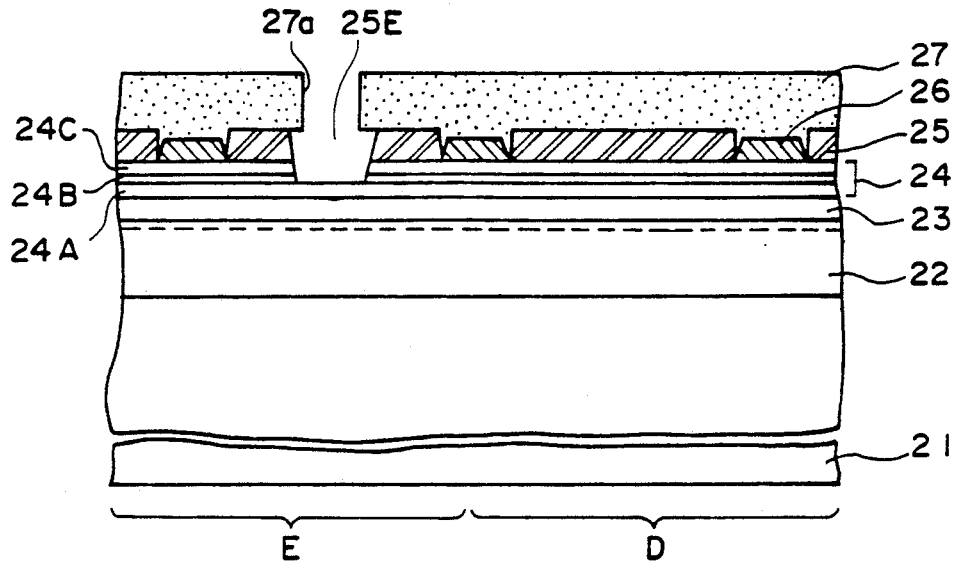

Next, as shown in FIG. 5, a photoresist 27 is applied on the structure of FIG. 4 and is subsequently patterned photolithographically so as to form a window 27a exposing a part of the silicon oxide layer 25 in correspondence to a gate of the enhancement-mode FET to be formed in the device. Then, the silicon oxide layer 25 is selectively removed in correspondence to the window 27a by hydrofluoric acid (HF). Subsequently, a reactive ion etching (RIE) process step is applied using an etching gas of $CCl_2F_2$ and helium. As a result, the GaAsSb layer 24C in the cap layer 24 are similarly removed. Note that the layer 24C is free from In and thus easily removed by RIE. This etching process automatically stops at the InAlAs layer 24B containing In. Note that the etching rate for GaAsSb is faster by a factor of about 50 than that for InAlAs when the foregoing etching gas is used. Further, a wet etching process using an aqueous solution of hydrogen peroxide ($H_2O_2$) and sulfuric acid ($H_2SO_4$) is applied so as to remove the InAlAs layer 24B exposed in the window 27a and a recessed gate structure 25E shown in FIG. 5 is obtained. Note that the GaAsSb layer 24A is exposed at the bottom of the recessed gate structure 25E.

Figure 6:
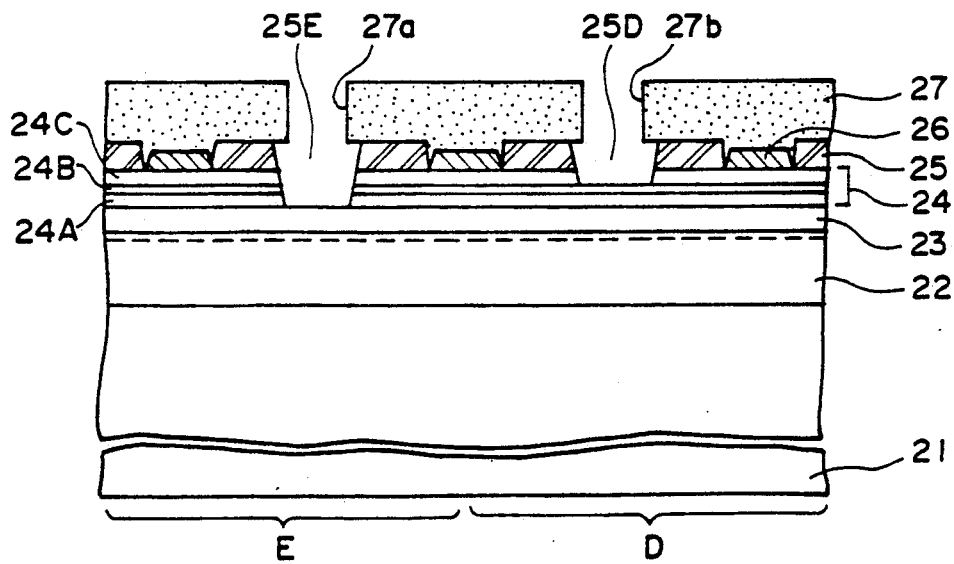

Next, as shown in FIG. 6, another window 27b is formed in the photoresist 27 by a photolithographic process so as to expose a part of the silicon oxide layer 25 in correspondence to a gate of the depletion-mode FET to be formed in the device. By applying the RIE process using the same etching gas again, the silicon oxide layer 25 and the GaAsSb layer 24C exposed by the window 27b is removed similarly to the foregoing etching process until the InAlAs layer 24B is exposed. Thereby a recessed gate structure 25D shown in FIG. 6 is obtained. At the same time, the GaAsSb layer 24A exposed at the bottom of the recessed gate structure 25E is also removed. The layer 24A is also free from In and thus the RIE process is applied effectively. The etching is continued until the doped layer 23 is exposed. Thus, a structure shown in FIG. 6 is obtained.

Next, a layer of a metal, for forming a the Schottky contact with InAlAs, is deposited on the structure of FIG. 6 by magnetron sputtering while leaving the photoresist 27 as it is. After the deposition, the photoresist is removed and the metal, for filling the recessed gate structures 25E and 25D, is applied by a lift-off patterning process step. As a result, the structure of a gate electrode 28a of the enhancement-mode FET having a flush surface with the silicon oxide layer 25 and a gate electrode 28b of the depletion-mode FET projecting above the silicon oxide layer 25 as shown in FIG. 7 is obtained.

Figure 7:
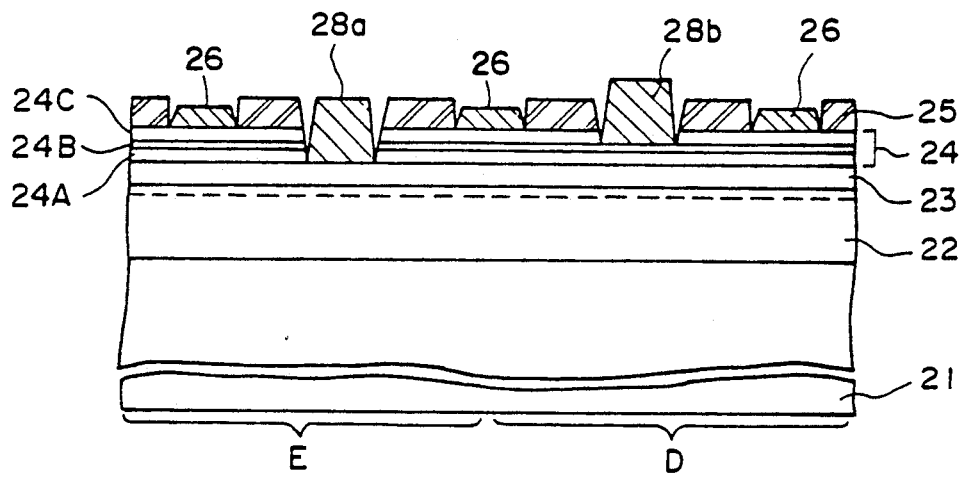

Next, an interlayer insulator 29 is provided on the structure of FIG. 7, by a chemical vapor deposition (CVD) or the like, and a metal interconnection 30 is provided so as to make an electrical contact with the electrodes 26, 28a and 28b via respective contact holes which in turn are provided in correspondence to the electrodes 26, 28a and 28b by known photolithographic patterning. Thus, the HEMT device shown in FIG. 8 is completed.

It should be noted that the selective etching process using the patterned photoresist 27 is also applicable to manufacture the device of FIG. 1. In this case, the layer 24B is not provided and the recessed gate structure 15a is formed by a single etching process step.

Figure 8:
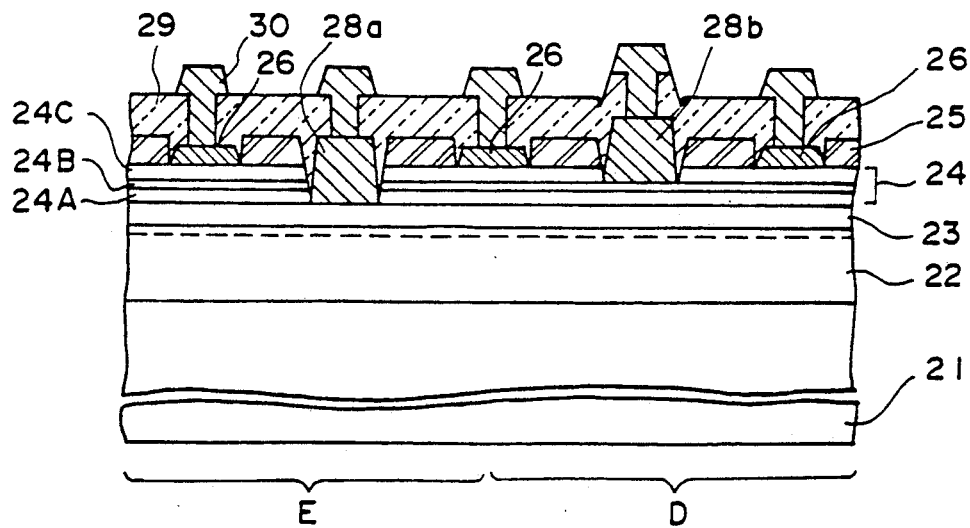

In the device of FIG. 8, the gate electrode 28a in contact with the doped layer 23 acts as the gate electrode of the enhancement mode FET having a source and a drain electrodes 26 at both sides thereof while the gate electrode 28b which is separated from the doped layer 23 by the cap layers 24A and 24B acts as the gate electrode of the depletion mode FET, having source and drain electrodes at the opposite sides. Further, the ohmic electrode 26 located between the gate electrode 28a and the gate electrode 28b is common and the device forms an inverter circuit.

In this device, the etching step for forming the recessed gate structures 25E and 25D is stopped exactly at the doped layer 23 and at the InAlAs layer 24B, each acting as an effective etching stop layer, and the distance between the active layer 22 and the gate electrode 28a or the distance between the active layer 22 and the gate electrode 28b is controlled precisely through the epitaxial growth. In other words, the threshold voltage of each of the enhancement-mode FET E and the depletion-mode FET D is controlled exactly at the time of manufacturing of the device.

Further, the present invention is not limited to these embodiments but various variations and modifications may be made without departing from the scope of the present invention.

What is claimed is:

1. A method of manufacturing a semiconductor device comprising a field effect transistor, with a heterojunction formed therein and utilizing a two-dimensional electron gas established at said heterojunction, comprising the steps of:
providing a first semiconductor layer of undoped indium gallium arsenide on a semi-insulating semiconductor substrate of indium phosphide as a channel layer in which the two-dimensional electron gas is generatable;
providing a second semiconductor layer of n-type indium aluminum arsenide on said first semiconductor layer;
providing a third semiconductor layer of n-type gallium arsenide antimonide on said second semiconductor layer;
providing an ohmic electrode on said third semiconductor layer in correspondence to source and drain of the field effect transistor;
applying a photoresist, having an opening exposing a part of said third semiconductor layer in correspondence to a gate of said field effect transistor, on said third semiconductor layer;
carrying out an anisotropic etching process acting selectively upon said third semiconductor layer for providing a groove in said exposed part of the third semiconductor layer such that a part of said second semiconductor layer is exposed, said step of anisotropic etching stopping automatically upon exposure of said second semiconductor layer; and
depositing a gate electrode by filling said groove with a conductive material.

2. A method as claimed in claim 1 in which said first through third semiconductor layers are provided by molecular beam epitaxy.

3. A method as claimed in claim 2 in which said first through third semiconductor layers are provided by metal-organic chemical vapor deposition.

4. A method as claimed in claim 1 in which said third semiconductor layer has a composition of $GaAs_xSb_{1-x}$ where x takes a value of about 0.51.

5. A method as claimed in claim 1 in which said second semiconductor layer is provided with a thickness chosen so as to provide a desired threshold voltage for the field effect transistor formed in the semiconductor device, and said step of anisotropic etching is performed by using an etching gas which reacts selectively with a material free from indium while not reacting with a material containing indium.

6. A method as claimed in claim 5 in which said etching gas comprises carbon dichloro-difluoride.

7. A method of manufacturing a semiconductor device comprising an enhancement-mode field effect transistor and a depletion-mode field effect transistor, with a heterojunction formed therein and utilizing a two-dimensional electron gas established at said heterojunction, comprising the steps of:
providing a first semiconductor layer of undoped indium gallium arsenide on a semi-insulating semiconductor substrate of indium phosphide as a channel layer in which the two-dimensional electron gas is generatable;
providing a second semiconductor layer of n-type indium aluminum arsenide as an electron-supply layer on said first semiconductor layer;
providing a third semiconductor layer of n-type gallium arsenide on said second semiconductor layer;
providing a fourth semiconductor layer of n-type indium aluminum arsenide on said third semiconductor layer;
providing a fifth semiconductor layer of n-type gallium arsenide antimonide on said fourth semiconductor layer;
providing ohmic electrodes on said fifth semiconductor layer in correspondence to source and drain of the enhancement-mode field effect transistor and the depletion-mode field effect transistor;
applying a photoresist, having an opening exposing a first part of said fifth semiconductor layer in correspondence to a gate of said enhancement-mode field effect transistor, on said fifth semiconductor layer;
carrying out a first etching process acting selectively upon said fifth semiconductor layer for providing a first groove in said exposed, first part of the fifth semiconductor layer such that a corresponding first part of said fourth semiconductor layer is exposed through said first groove, said first etching process stopping automatically upon exposure of said fourth semiconductor layer through said first groove;

carrying out a second etching process for extending said first groove by removing said first part of the fourth semiconductor layer thereby to expose a corresponding part of the third semiconductor layer;

forming another opening in said photoresist for exposing therethrough a second part of said fifth semiconductor layer in correspondence to a gate of said depletion-mode field effect transistor;

carrying out a third etching process acting selectively upon said fifth and third semiconductor layers for providing a second groove in said exposed, second part of said fifth semiconductor layer such that a corresponding, second part of the fourth semiconductor layer is exposed through said second groove and for further extending said first groove so as to expose a corresponding part of the second semiconductor layer, said third etching process step acting upon said fifth semiconductor layer and stopping automatically upon exposure of said fourth semiconductor layer through said second groove and acting upon said third semiconductor layer and stopping automatically upon exposure of said second semiconductor layer through said first groove; and providing a first gate electrode and a second gate electrode by filling said first groove and second groove with a conductive material.

8. A method as claimed in claim 7 in which said first through fifth semiconductor layers are provided by molecular beam epitaxy.

9. A method as claimed in claim 7 in which said first through fifth semiconductor layers are provided by metal-organic chemical vapor deposition.

10. A method as claimed in claim 7 in which said second semiconductor layer is provided with a thickness chosen so as to provide a desired threshold voltage for the enhancement-mode field effect transistor formed in the semiconductor device, and said second through fourth semiconductor layers are provided with a thickness chosen so as to provide a desired threshold voltage for the depletion-mode field effect transistor.

11. A method as claimed in claim 7 in which said first and third etching process are performed by using an etching gas which reacts selectively with a material free from indium while not reacting with a material containing indium.

12. A method as claimed in claim 11 in which said etching gas comprises carbon dichloro-difluoride.

13. A method of manufacturing a semiconductor device comprising steps of:
  providing a second semiconductor layer of gallium arsenide antimonide on a first semiconductor layer containing indium; and
  selectively removing a part of said second semiconductor layer by an etching process using a chloride etching gas such that the first semiconductor layer is exposed through said part of the second semiconductor layer.

14. A method as claimed in claim 13 in which said first semiconductor layer comprises indium aluminum arsenide.

* * * * *

UNITED STATES PATENT AND TRADEMARK OFFICE
CERTIFICATE OF CORRECTION

PATENT NO. : 5,118,637          Page 1 of 2
DATED : June 2, 1992
INVENTOR(S) : Tomonori ISHIKAWA It is certified that error appears in the above-indentified patent and that said Letters Patent is hereby corrected as shown below:

TITLE PAGE, under "OTHER PUBLICATIONS", Fathimulla et al., change "InGaAs/InGaAs" to --InAlAs/InGaAs--.

TITLE PAGE, under [57] "ABSTRACT", make the following changes:
    line 2, delete "said";
    line 11, change "defining" to --having--.

Col. 2,     line 9, change "invertor" to --inverter--;
    line 30, change "□" to --⌐--;
    line 32, change "donor" to --donors--;
    line 36, change "HEMT a" to --a HEMT--; and change "for" to --the--;
    line 40, after "as" insert --an--; and after "of" insert --the--.

Col. 3,     line 13, change "electron" to --electrons--;
    line 53, after "invention" insert --.--.

Col. 4,     line 11, after "gas" insert --,--;
    line 22, change "electron" to --electrons--;
    line 29, change "in the" to --of--; and change "of" to --in the--;
    line 32, after "in" insert --the--;
    line 52, change "electron" to --electrons--;
    line 60, change "EF" to --$E_F$--; and change "gap" to --gaps in--;
    line 61, delete "in".

UNITED STATES PATENT AND TRADEMARK OFFICE
CERTIFICATE OF CORRECTION

PATENT NO. : 5,118,637
DATED : June 2, 1992
INVENTOR(S) : Tomonori ISHIKAWA

It is certified that error appears in the above-indentified patent and that said Letters Patent is hereby corrected as shown below:

Col. 5,  line 38, change "an" to --a--;
         line 39, change "In0.52As$_{0.48}$As" to --In$_{0.62}$Al$_{0.48}$As--.

Col. 6,  line 67, delete "the".

Col. 7,  line 27, delete "a";
         line 28, delete "a".

Signed and Sealed this

Fourteenth Day of June, 1994

BRUCE LEHMAN

Attesting Officer          Commissioner of Patents and Trademarks